United States Patent
Takahashi

(10) Patent No.: US 11,275,420 B2
(45) Date of Patent: Mar. 15, 2022

(54) MICROCOMPUTER INPUT/OUTPUT CIRCUIT

(71) Applicant: Sumitomo Wiring Systems, Ltd., Mie (JP)

(72) Inventor: Hiroaki Takahashi, Mie (JP)

(73) Assignee: Sumitomo Wiring Systems, Ltd., Yokkaichi (JP)

(*) Notice: Subject to any disclaimer, the term of this patent is extended or adjusted under 35 U.S.C. 154(b) by 324 days.

(21) Appl. No.: 16/613,841

(22) PCT Filed: Apr. 11, 2018

(86) PCT No.: PCT/JP2018/015242
§ 371 (c)(1),
(2) Date: Nov. 15, 2019

(87) PCT Pub. No.: WO2018/211872
PCT Pub. Date: Nov. 22, 2018

(65) Prior Publication Data
US 2020/0166981 A1   May 28, 2020

(30) Foreign Application Priority Data
May 18, 2017  (JP) .............................. JP2017-099171

(51) Int. Cl.
*G06F 1/26* (2006.01)
*G05F 1/12* (2006.01)
(Continued)

(52) U.S. Cl.
CPC ............... *G06F 1/28* (2013.01); *B60R 16/02* (2013.01); *G05F 1/12* (2013.01)

(58) Field of Classification Search
CPC ..................................... G06F 1/26; G05F 1/12
See application file for complete search history.

(56) References Cited

U.S. PATENT DOCUMENTS 5,838,509 A * 11/1998 Yun .................. G11B 20/10009
360/46
2003/0042918 A1 * 3/2003 Lam ..................... G09B 23/183
324/711
2012/0306557 A1  12/2012 Lin

FOREIGN PATENT DOCUMENTS

JP    H7-016237 U    3/1995
JP    H10-257791 A   9/1998
(Continued)

OTHER PUBLICATIONS

International Search Report, Application No. PCT/JP2018/015242, dated Jul. 10, 2018. ISA/Japan Patent Office.

*Primary Examiner* — Mark A Connolly
(74) *Attorney, Agent, or Firm* — Honigman LLP

(57) ABSTRACT

A microcomputer input/output circuit is provided with a microcomputer, a power supply, a power supply resistor that is connected at one end to the power supply and alternately connected at an another end to grounded external resistors via a switch, a power supply voltage monitoring unit capable of monitoring a power supply voltage, a divided voltage value monitoring unit capable of monitoring a divided voltage value obtained through voltage division by the power supply resistor and a selected one of the external resistors and an external resistor specification means that specifies the external resistor selected by the switch depending on which divided voltage value range corresponding to each of the external resistors the divided voltage value is included, and the external resistor specification means A changes the divided voltage value ranges based on the power supply voltage acquired by the power supply voltage monitoring unit.

5 Claims, 3 Drawing Sheets

Legend
A= External resistor specification means

(51) Int. Cl.
    *G06F 1/28*         (2006.01)
    *B60R 16/02*     (2006.01)

(56) References Cited

FOREIGN PATENT DOCUMENTS

| | | |
|---|---|---|
| JP | 2014-033309 A | 2/2014 |
| JP | 2015-134526 A | 7/2015 |
| JP | 2017-077068 A | 4/2017 |

\* cited by examiner

Legend
A= External resistor specification means

Legend
A= Divided voltage range of Vc
B= Divided voltage range of Vb

MICROCOMPUTER INPUT/OUTPUT CIRCUIT

CROSS-REFERENCE TO RELATED APPLICATIONS

This application is the U.S. national stage of PCT/JP2018/015242 filed on Apr. 11, 2018, which claims priority of Japanese Patent Application No. JP 2017-099171 filed on May 18, 2017, the contents of which are incorporated herein.

TECHNICAL FIELD

The present disclosure relates to a microcomputer input/output circuit.

BACKGROUND

Heretofore, microcomputer input/output circuits have been used as means for controlling operations and the like of various electrical devices, with operating information or the like of an electrical device being input to a microcomputer, and the electrical device being operated based on a control signal output from the microcomputer. For example, in FIG. 1 of JP 10-257791, switching a P/W switch to up and down results in operating information of a power window being input to a microcomputer, and a control signal for driving the power window based on this input information being output to a motor.

Incidentally, in the conventional microcomputer input/output circuit described in JP 10-257791, the microcomputer requires an input terminal respectively for up and for down of the P/W switch, as shown in FIG. 1.

However, in order to address demands for increased multifunctionality in vehicles and the like in recent years, there are calls to be able to input multiple pieces of operating information with one input terminal, given that it is extremely inefficient to use two input terminals simply for switching a power window up and down.

As such, it is known that multiple pieces of operating information can be input with one input terminal, using divided voltage values obtained by dividing a given power supply voltage with two resistors, for example. More specifically, by alternately switching the resistance value of one of the two resistors to a plurality of external resistors having mutually different resistance values with a switch for every piece of operating information, multiple pieces of operating information can be input with one input terminal.

However, given that the divided voltage values obtained by this method have a width that depends on variance in the power supply voltage and the resistors, the divided voltage values representing external resistors that correspond to multiple pieces of operating information overlap, and it can be difficult to designate the range of divided voltage values representing individual pieces of operating information (external resistors). In order to solve this problem, it is conceivable to reduce the variance of divided voltage values by, for example, adding a constant voltage IC and converting the power supply voltage to a constant voltage, although this leads to increased costs and is arguably not an effective measure. Another conceivable measure is to monitor the power supply voltage and, for every power supply voltage, calculate a threshold of the divided voltage values for every external resistor by computational processing so as to avoid overlap, and determine selected operating information, although this is arguably not an effective measure given that complex computational processing is required, and there is still room for improvement.

The present disclosure has been made against the background of the abovementioned circumstances, and the problem is solved by providing a microcomputer input/output circuit having a novel structure that is able to determine operating information corresponding to divided voltage values in a stable manner, without requiring additional components that lead to increased costs or complex computational processing.

SUMMARY

A first aspect of the present disclosure is a microcomputer input/output circuit including a microcomputer, a power supply, a power supply resistor configured such that one end is connected to the power supply and another end is alternately connected to a plurality of grounded external resistors having different resistance values via a switch, a power supply voltage monitoring unit configured to monitor a power supply voltage of the power supply, a divided voltage value monitoring unit configured to monitor a divided voltage value obtained through voltage division by the power supply resistor and the external resistor that is selected, and an external resistor specification means configured to specify the external resistor selected by the switch depending on which divided voltage value range corresponding to each of the external resistors the divided voltage value obtained by the divided voltage value monitoring unit is included, and the external resistor specification means changing the divided voltage value ranges based on the power supply voltage acquired by the power supply voltage monitoring unit.

According to this aspect, the external resistor specification means changes the divided voltage value ranges based on the power supply voltage acquired by the power supply voltage monitoring unit. Accordingly, even in cases such as where the ranges of divided voltage values of two external resistors having adjacent resistance values overlap, the divided voltage value ranges of the external resistors can be divided into a plurality of divided voltage value ranges that do not include an overlapping region based on the power supply voltage, and the divided voltage value ranges to be used can be changed according to the acquired power supply voltage. It is thereby possible to avoid any difficulties in designating the ranges of divided voltage values representing individual pieces of operating information (external resistors) due to overlap between the divided voltage values representing external resistors corresponding to multiple pieces of operating information. In this way, according to this aspect, external resistors corresponding to divided voltage values can be reliably specified with a simple structure and it becomes possible to distinguish operating information corresponding to external resistors.

A second aspect of the present disclosure is the microcomputer input/output circuit according to the first aspect, in which the external resistor specification means changes the divided voltage value ranges when the power supply voltage exceeds or becomes greater than or equal to a first threshold, and, after the power supply voltage exceeds or becomes greater than or equal to the first threshold, does not change the divided voltage value ranges until the power supply voltage drops below or becomes less than or equal to a second threshold that is smaller than the first threshold.

According to this aspect, the divided voltage value ranges that are selected is changed when the power supply voltage exceeds or becomes greater than or equal to a first threshold, and after the power supply voltage exceeds or becomes greater than or equal to the first threshold, the divided voltage value ranges are not changed until the power supply voltage drops below or becomes less than or equal to a second threshold that is smaller than the first threshold. Thereby, compared with the case where the divided voltage value ranges are changed based on a single threshold, the problem of the divided voltage value ranges that are selected switching frequently due to minute fluctuations caused by noise in the vicinity of the threshold or the like also tends not to occur, and a stable specification operation is realized.

A third aspect of the present disclosure is the microcomputer input/output circuit according to the second aspect, in which the plurality of external resistors include two external resistors having adjacent resistance values, the external resistor specification means, in a case where the divided voltage value range of the external resistor on a low resistance side and the divided voltage value range of the external resistor on a high resistance side include an overlapping region in which the divided voltage value ranges overlap, uses the power supply voltage corresponding to a lower limit of the divided voltage values of the overlapping region as the first threshold, and uses the power supply voltage corresponding to an upper limit of the divided voltage values of the overlapping region as the second threshold, until the power supply voltage exceeds or becomes greater than or equal to the first threshold, the external resistor specification means sets the divided voltage value ranges of the two external resistors so as to eliminate the overlapping region of the external resistor on the low resistance side, and until the power supply voltage exceeds or becomes greater than or equal to the first threshold and drops below or becomes less than or equal to the second threshold, the external resistor specification means sets the divided voltage value ranges of the two external resistors so as to eliminate the overlapping region of the external resistor on the high resistance side.

According to this aspect, in the case where the divided voltage value ranges of external resistors include an overlapping region in which the divided voltage value ranges overlap, the power supply voltage corresponding to the lower limit of the divided voltage values of the overlapping region is used as the first threshold, and the power supply voltage corresponding to the upper limit of the divided voltage values of the overlapping region is used as the second threshold. Until the power supply voltage exceeds or becomes greater than or equal to the first threshold, the external resistor specification means employs the divided voltage value ranges of the two external resistors set so as to eliminate the overlapping region of the external resistor on the low resistance side. Furthermore, until the power supply voltage exceeds or becomes greater than or equal to the first threshold and drops below or becomes less than or equal to the second threshold, the external resistor specification means employs the divided voltage value ranges of the two external resistors set so as to eliminate the overlapping region of the external resistor on the high resistance side. The external resistor specification means changing of the divided voltage value ranges of the two external resistors such that overlap of those external resistors does not occur is thereby reliably realized. As a result, the problem of divided voltage values overlapping is reliably avoided, enabling external resistors (operating information) to be specified from divided voltage values in a simple and stable manner.

A fourth aspect of the present disclosure is the microcomputer input/output circuit according to the second aspect, in which the external resistor specification means has a relational table, acquired in advance, showing the relationship between the power supply voltage and the divided voltage value ranges, and, in a case where the divided voltage value ranges of two of the external resistors having adjacent resistance values include an overlapping region in which the divided voltage value ranges overlap, has, in the relation table, a first judgment table in which the power supply voltage corresponding to a lower limit of the divided voltage values of the overlapping region is added as the first threshold, and a second judgment table in which the power supply voltage corresponding to an upper limit of the divided voltage values of the overlapping region is added as the second threshold, in the first judgment table, the divided voltage value ranges of the external resistors are set so as to eliminate the overlapping region of the external resistor on a low resistance side with the first threshold as a boundary, and, in the second judgment table, the divided voltage value ranges of the external resistors are set so as to eliminate the overlapping region of the external resistor on a high resistance side with the second threshold as a boundary, and the external resistor specification means selects the first judgment table until the power supply voltage exceeds or becomes greater than or equal to the first threshold, selects the second judgment table until the power supply voltage drops below or becomes less than or equal to the second threshold after exceeding the first threshold, and specifies the external resistor corresponding to the divided voltage value based on the judgment tables.

According to this aspect, even in the case where the divided voltage value ranges of two external resistors having adjacent resistance values overlap in a relational table of power supply voltages and divided voltage value ranges of external resistors acquired in advance, external resistors corresponding to divided voltage values can be easily and reliably specified, and operating information corresponding to external resistors can be distinguished, by performing external resistor specification after dividing the relational table into first/second judgment tables that do not include an overlapping region. Specifically, in the first judgment table, the divided voltage value range of each external resistor is set so as to eliminate the overlapping region of the external resistor on the low resistance side, with the power supply voltage corresponding to the lower limit of the divided voltage values of the overlapping region as the first threshold. In the second judgment table, the divided voltage value range of each external resistor is set so as to eliminate the overlapping region of the external resistor on the high resistance side, with the power supply voltage corresponding to the upper limit of the divided voltage values of the overlapping region as the second threshold. Therefore, as a result of the external resistor specification means specifying external resistors from the divided voltage values based on the first judgment table until the power supply voltage exceeds or becomes greater than or equal to the first threshold, and specifying external resistors from the divided voltage values based on the second judgment table until the power supply voltage exceeds or becomes greater than or equal to the first threshold and decreases below or becomes less than or equal to the second threshold, the problem of divided voltage values overlapping is reliably avoided, enabling external resistors (operating information) to be specified from divided voltage values in a simple and stable manner.

In particular, a first threshold and a second threshold are provided, and the first judgment table is used continuously until the power supply voltage exceeds or becomes greater than or equal to the first threshold, and once the power supply voltage exceeds or become greater than or equal to the first threshold, the second judgment table is used continuously until the power supply voltage decreases below or becomes less than or equal to the second threshold, and thus compared with the case where the first/second judgment tables are switched based on a single threshold, the problem of the tables switching frequently due to minute fluctuations caused by noise in the vicinity of the threshold or the like also tends not to occur, and a stable specification operation is realized.

A fifth aspect of the present disclosure is the microcomputer input/output circuit according to the third or fourth aspect, in which, in the first judgment table, the divided voltage value at the first threshold is set as an upper limit of the divided voltage value range of the external resistor on the low resistance side, and the divided voltage value range of the external resistor on the high resistance side is set to a range above the divided voltage value at the first threshold, in the second judgment table, the divided voltage value at the second threshold is set as a lower limit of the divided voltage value range of the external resistor on the high resistance side, and the divided voltage value range of the external resistor on the low resistance side is set to a smaller range than the divided voltage value at the second threshold, and the external resistor specification means selects the first judgment table until the power supply voltage exceeds the first threshold, and selects the second judgment table until the power supply voltage drops below the second threshold after exceeding the first threshold.

According to this aspect, the divided voltage value at the first threshold is included in the divided voltage value range on the low resistance side, and the second judgment table is selected when the power supply voltage value exceeds the first threshold. Also, the divided voltage value at the second threshold is included in the divided voltage value range on the high resistance side, and the first judgment table is returned to when the power supply voltage drops below the second threshold. Therefore, it becomes possible to set tables and divided voltage value ranges in a more intelligible manner.

Advantageous Effects of Disclosure

According to the present disclosure, even in the case where the ranges of the divided voltage values of two external resistors having adjacent resistance values overlap, these ranges of the divided voltage values can be divided (changed) into a plurality of divided voltage value ranges that do not include an overlapping region based on the power supply voltage. Therefore, external resistors corresponding to divided voltage values can be specified in a simple and reliable manner and operating information corresponding to external resistors can be distinguished.

DETAILED DESCRIPTION OF PREFERRED EMBODIMENTS

Hereinafter, embodiments of the present disclosure will be described, with reference to the drawings.

Figure 1:
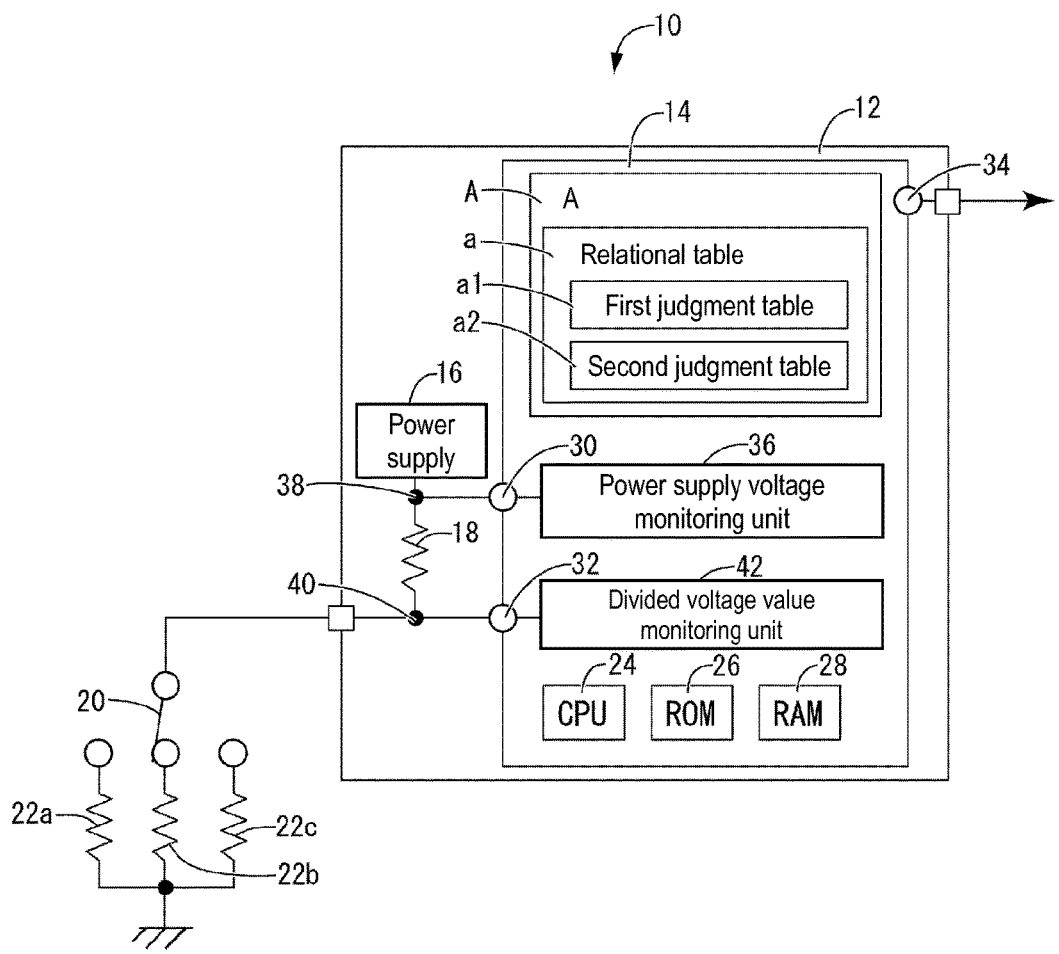
FIG. 1 is a block diagram showing a microcomputer input/output circuit serving as one embodiment of the present disclosure.

A microcomputer input/output circuit 10 structured according to one embodiment of the present disclosure is shown in FIG. 1. The present embodiment will be described, taking the case where the microcomputer input/output circuit 10 of the present disclosure is applied to an in-vehicle body ECU (Electronic Control Unit) 12 that controls various body-related control targets such as power windows and the like that are installed in a vehicle as an example.

As shown in FIG. 1, the microcomputer input/output circuit 10 is constituted to include a microcomputer 14, a power supply 16, a power supply resistor 18, and a plurality (three in the present embodiment) of external resistors 22a to 22c that are provided externally to the in-vehicle body ECU 12 and are connected to the in-vehicle body ECU 12 via a switch 20.

The microcomputer 14 includes a CPU (Central Processing Unit) 24, a ROM (Read Only Memory) 26, a RAM (Random Access Memory) 28, a first input port 30, a second input port 32, and an output port 34. Also, the microcomputer 14 is provided with an external resistor specification means A, a relational table a, a first judgment table $a_1$ and a second judgment table $a_2$ which will be described later, these being stored in the ROM 26 and realized by software that is executed by the CPU 24. Note that the ROM 26 is, basically, read-only during operation of the in-vehicle body ECU 12, but can be rewritten in the case where updating of a computer program to be executed by the CPU 24 or updating of the tables a, $a_1$ and $a_2$ is required. Also, the RAM 28 temporarily stores various information that arises through processing, in addition to computer programs that are read by the CPU 24 being loaded thereto.

The first/second input ports 30 and 32 and the output port 34 are interfaces between the microcomputer 14 and the outside. The microcomputer 14 is provided with a power supply voltage monitoring unit 36 capable of monitoring a power supply voltage: Vd(V) and constituted with the power supply 16 being connected to the first input port 30, and a divided voltage value monitoring unit 42 capable of monitoring divided voltage values and constituted with the power supply resistor 18, which is connected at one end 38 to the power supply 16, being connected at another end 40 to the second input port 32. That is, the other end 40 of the power supply resistor 18 is configured to be alternately connected to the plurality (three in the present embodiment) of external resistors 22a to 22c having different resistance values (in the present embodiment, the external resistor 22a has the lowest resistance and the external resistor 22c has the highest resistance) via the switch 20, and a divided voltage value of the power supply voltage divided by the power supply resistor 18 and one of the external resistors 22a to 22c is input to the second input port 32, and this divided voltage value can be monitored with the divided voltage value monitoring unit 42. Also, the output port 34 is configured such that control signals corresponding to the external resistors 22a to 22c specified by the external resistor specification means A described later are output. For example, in the case where the external resistor 22a is specified as being selected, a control signal for closing all the power windows which are not illustrated is output, in the case where the external resistor 22b is specified as being selected, a control signal for opening only the power window on the driver's side is output, and in the case where the external resistor 22c is specified as being selected, a control signal for closing only the power window on the driver's side is output.

Next, the external resistor specification means A for specifying the external resistors 22a to 22c selected by the switch 20, based on the power supply voltage: Vd(V) acquired by the power supply voltage monitoring unit 36 and the divided voltage value acquired by the divided voltage value monitoring unit 42, using the microcomputer input/output circuit 10 of this embodiment, will be described.

Figure 2:
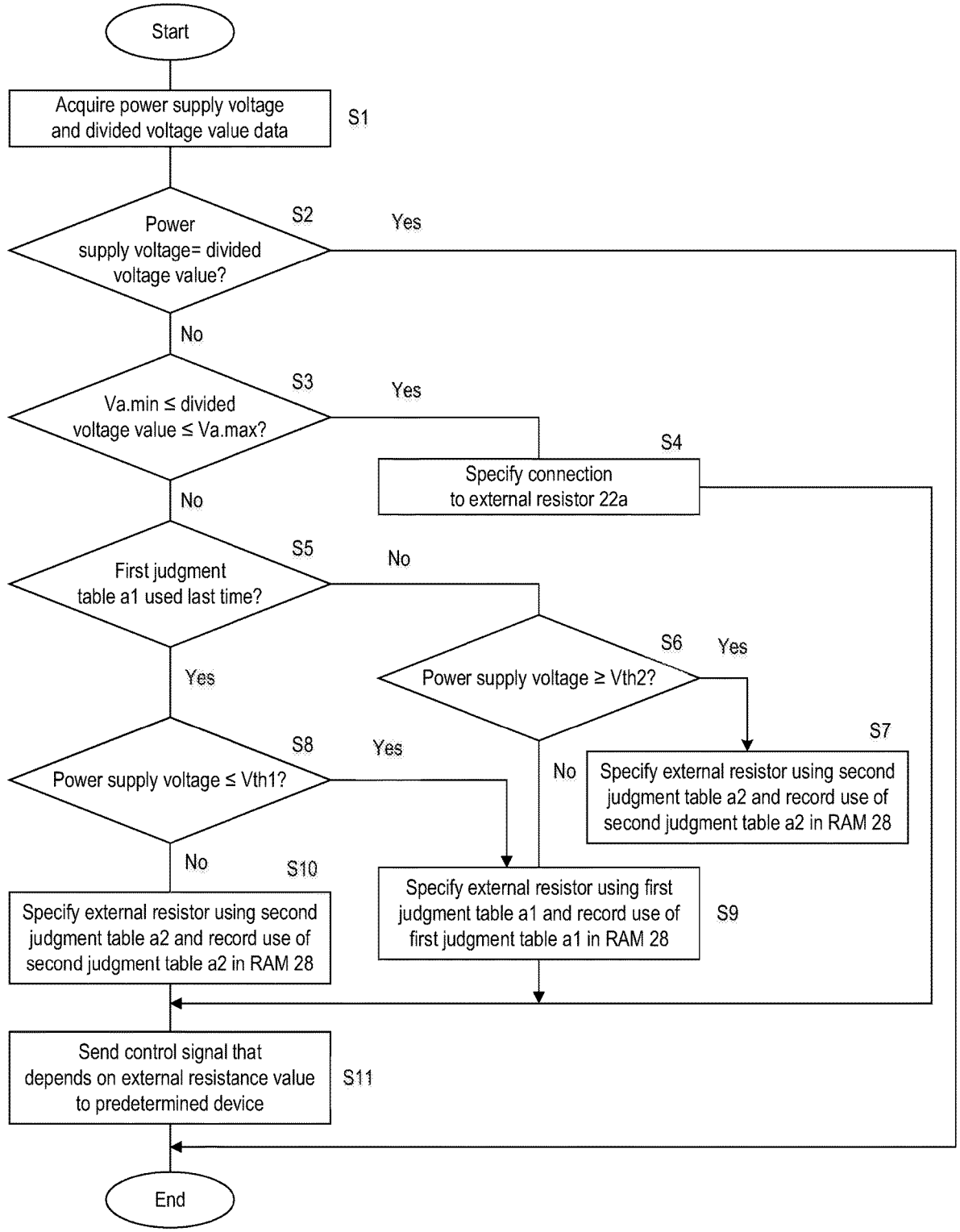
FIG. 2 is a flowchart showing a control method of the present disclosure.

FIG. 2 shows the processing contents of the external resistor specification means A of the microcomputer input/output circuit 10 of the present disclosure. This control processing is configured to be started (executed) every predetermined time interval (e.g., every few milliseconds). First, the external resistor specification means A, in S1, acquires a power supply voltage with the power supply voltage monitoring unit 36, and acquires a divided voltage value with the divided voltage value monitoring unit 42.

Next, the processing advances to S2, where it is determined whether the power supply voltage and the divided voltage value acquired in S1 are equal, and, if the power supply voltage and the divided voltage value are equal (S2=Yes), it is judged that none of the external resistors 22a to 22c are connected to the switch 20, and the series of operations shown in FIG. 2 is completed, without any control signal being output from the output port 34.

Figure 3:
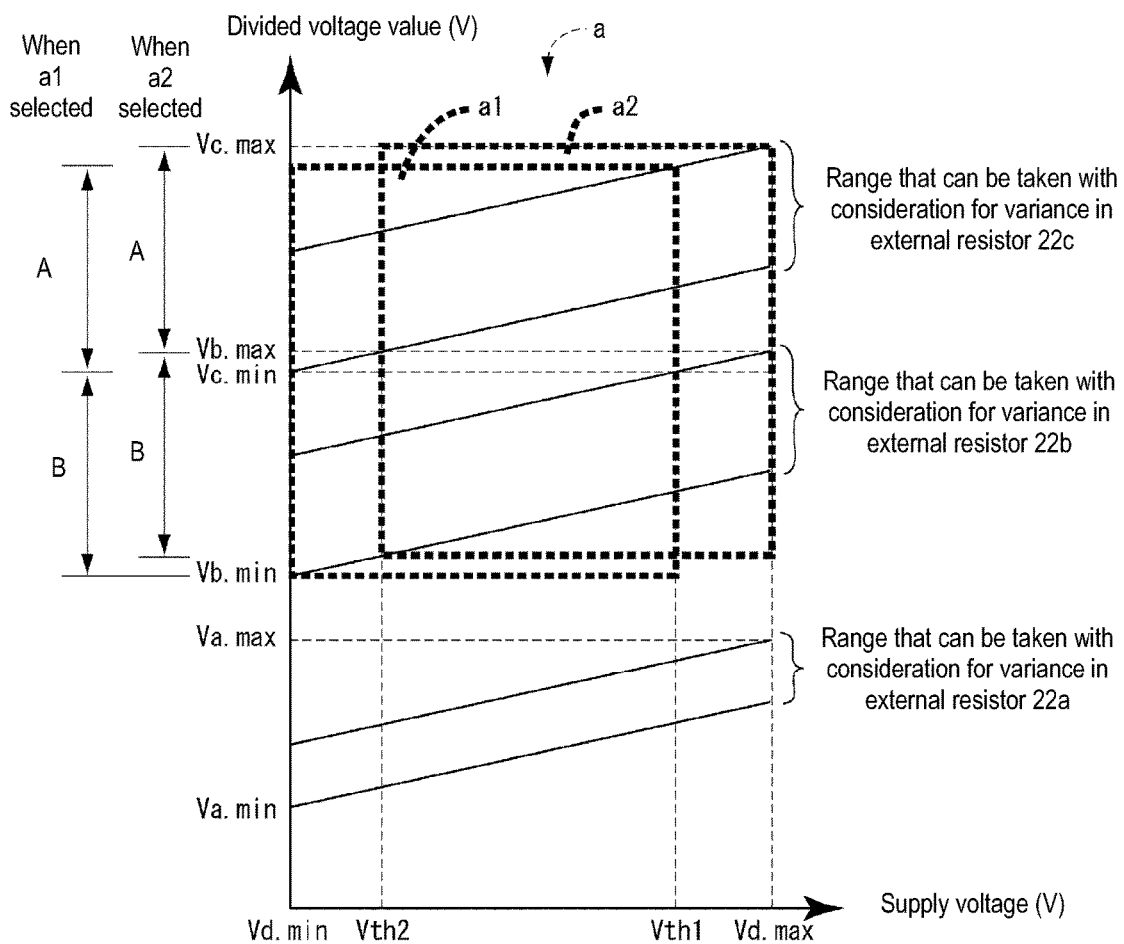
FIG. 3 is a diagram for describing the control method shown in FIG. 2, and shows the power supply voltage that is input to a microcomputer and the ranges of divided voltage values that can be taken.

On the other hand, if the power supply voltage and the divided voltage value are not equal (S2=No), the processing advances to the following S3. More specifically, in the steps from S3, an operation for specifying which of the external resistors 22a to 22c the switch 20 is connected to is performed. Here, the external resistor specification means A has a relational table a, acquired in advance, showing the relationship between the power supply voltage and the divided voltage value ranges when each of the external resistors 22a, 22b and 22c is selected. This relational table a is, as shown in FIG. 3, obtained by tabulating, for each of the external resistors 22a, 22b and 22c, the respective ranges (Va.min to Va.max, Vb.min to Vb.max, Vc.min to Vc.max) that the divided voltage values can take with consideration for variance in each of the external resistors 22a, 22b and 22c, in the range (Vd.min to Vd.max) that the power supply voltage can take with consideration for variance. As shown in FIG. 3, among the ranges that the divided voltage values of these external resistors 22a, 22b and 22c can take, the range (Va.min to Va.max) that the divided voltage values of the external resistor 22a can take does not overlap with the range (Vb.min to Vb.max) that the divided voltage values of the external resistor 22b having adjacent resistance values can take. Therefore, in S3, it is determined whether the divided voltage value acquired in S1 is in the range of Va.min to Va.max, and, if this divided voltage value is within the above range (S3=Yes), the processing advances to S4, and after specifying that the switch 20 is connected to the external resistor 22a, the processing advances to S11, where a control signal corresponding to the external resistor 22a is output from the output port 34 to complete the series of operations shown in FIG. 2.

On the other hand, if the divided voltage value is not within the above range (S3=No), the processing advances to the following S5. The case where, as shown in FIG. 3, the divided voltage value ranges (Vb.min to Vb.max, Vc.min to Vc.max) of the two external resistors 22b and 22c having adjacent resistance values include an overlapping region (Vc.min to Vb.max) in which the divided voltage value ranges overlap will be described in the steps from S5. In this case, as shown in FIG. 3, a first judgment table $a_1$ in which the power supply voltage corresponding to a lower limit (Vc.min) of the divided voltage values in the overlapping region is added as a first threshold (Vth1) and a second judgment table $a_2$ in which the power supply voltage corresponding to an upper limit (Vb.max) of the divided voltage values in the overlapping region is added as a second threshold (Vth2) are provided in the relational table a. More specifically, in the first judgment table $a_1$, the divided voltage value range (Vb.min to Vc.min) of the external resistor 22b on the low resistance side is set so as to eliminate the overlapping region (Vc.min to Vb.max) of the external resistor 22b with the first threshold (Vth1) as the boundary, and, in the second judgment table $a_2$, the divided voltage value range (Vb.max to Vc.max) of the external resistor 22c is set so as to eliminate the overlapping region (Vc.min to Vb.max) of the external resistor 22c on the high resistance side with the second threshold (Vth2) as the boundary. That is, in the first judgment table $a_1$, the divided voltage value (Vc.min) of the first threshold (Vth1) is set as the upper limit of the divided voltage value range of the external resistor 22b on the low resistance side, and the divided voltage value range of the external resistor 22c on the high resistance side is set to a range above the divided voltage value (Vc.min). On the other hand, in the second judgment table $a_2$, the divided voltage value (Vb.max) of the second threshold (Vth2) is set as the lower limit of the divided voltage value range of the external resistor 22c on the high resistance side, and the divided voltage value range of the external resistor 22b on the low resistance side is set to a smaller range than the divided voltage value (Vb.max).

If, in S3, the divided voltage value acquired in S1 is not in the range of Va.min to Va.max (S3=No), the processing advances to S5, where it is determined whether the external resistor 22b was specified using the first judgment table $a_1$ in the last series of operations of the external resistor specification means A, and if the first judgment table $a_1$ was not used (S5=No), it is judged that the second judgment table $a_2$ was used last time, and the processing advances to S6, where it is determined whether the power supply voltage acquired in S1 is greater than or equal to the second threshold (Vth2). Here, if the power supply voltage is greater than or equal to the second threshold (Vth2) (S6=Yes), the processing advances to S7, and after determining which of the external resistor 22b and the external resistor 22c the switch 20 is connected to using the second judgment table $a_2$, and recording that the second judgment table $a_2$ was used in the RAM 28, the processing advances to S11, where a control signal corresponding to the specified external resistor 22b or external resistor 22c is output from the output port 34 to complete the series of operations shown in FIG. 2. On the other hand, if the power supply voltage is less than the second threshold (Vth2) (S6=No), the processing advances to S9, and after determining which of the external resistor 22b and the external resistor 22c the switch 20 is connected to using the first judgment table $a_1$, and recording that the first judgment table $a_1$ was used in the RAM 28, the processing advances to S11, where a control signal corresponding to the specified external resistor 22b or external resistor 22c is output from the output port 34 to complete the series of operations shown in FIG. 2. That is, in S9, the external resistor specification means A specifies the external resistor after having changed the divided voltage value ranges of the external resistors 22b and 22c, based on the power supply voltage acquired by the power supply voltage monitoring unit 36.

On the other hand, if the external resistor 22b was specified using the first judgment table $a_1$ in the last series of operations of the external resistor specification means A (S5=Yes), the processing advances to S8, where it is determined whether the power supply voltage acquired in S1 is less than or equal to the first threshold (Vth1). Here, if the power supply voltage is less than or equal to the first threshold (Vth1) (S8=Yes), the processing advances to S9, and after determining which of the external resistor 22b and the external resistor 22c the switch 20 is connected to using the first judgment table $a_1$, and recording that the first judgment table $a_1$ was used in the RAM 28, the processing advances to S11, where a control signal corresponding to the specified external resistor 22b or external resistor 22c is output from the output port 34 to complete the series of operations shown in FIG. 2. On the other hand, if the power supply voltage exceeds the first threshold (Vth1) (S8=No), the processing advances to S10, and after determining which of the external resistor 22b and the external resistor 22c the switch 20 is connected to using the second judgment table $a_2$, and recording that the second judgment table $a_2$ was used in the RAM 28, the processing advances to S11, where a control signal corresponding to the specified external resistor 22b or external resistor 22c is output from the output port 34 to complete the series of operations shown in FIG. 2.

As is clear from the above description, in the processing steps of the external resistor specification means A, the first judgment table $a_1$ is selected until the power supply voltage exceeds the first threshold (Vth1), and the external resistor 22b or 22c corresponding to the divided voltage value is specified based on the first judgment table $a_1$, whereas the second judgment table $a_2$ is selected until the power supply voltage drops below the second threshold (Vth2) after exceeding the first threshold (Vth1), and the external resistor 22b or 22c corresponding to the divided voltage value is specified based on the second judgment table $a_2$.

With the microcomputer input/output circuit 10 structured according to the present embodiment, even in the case where the divided voltage value ranges (Vb.min to Vb.max, Vc.min to Vc.max) of the two external resistors 22b and 22c having adjacent resistance values include an overlapping region (Vc.min to Vb.max) in which the divided voltage value ranges overlap, in the relational table a, acquired in advance, showing the relationship between the power supply voltage and the divided voltage value ranges when each of the external resistors 22a, 22b and 22c is selected, the external resistors 22b or 22c corresponding to the divided voltage value can be specified in a simple and reliable manner, by constituting this relational table a with the first judgment table $a_1$ and the second judgment table $a_2$. That is, as shown in FIG. 3, in the first judgment table $a_1$, the divided voltage value range of the external resistor 22b (Vb.min to Vc.min) is set so as to eliminate the overlapping region (Vc.min to Vb.max) of the external resistor 22b on the low resistance side with the first threshold (Vth1) as the boundary, and, in the second judgment table $a_2$, the divided voltage value range of the external resistor 22c (Vb.max to Vc.max) is set so as to eliminate the overlapping region (Vc.min to Vb.max) of the external resistor 22c on the high resistance side with the second threshold (Vth2) as the boundary. Moreover, in the processing steps of the external resistor specification means A, the external resistor 22b or 22c corresponding to the divided voltage value is specified based on the first judgment table $a_1$ until the power supply voltage exceeds the first threshold (Vth1), and the external resistor 22b or 22c corresponding to the divided voltage value is specified based on the second judgment table $a_2$ until the power supply voltage drops below the second threshold (Vth2) after exceeding the first threshold (Vth1). The problem of divided voltage values overlapping is thereby reliably avoided, enabling external resistors (operating information) to be specified from divided voltage values in a simple and stable manner.

Additionally, a first threshold (Vth1) and a second threshold (Vth2) are provided, and the first judgment table $a_1$ is selected continuously until the power supply voltage exceeds the first threshold (Vth1), and once the power supply voltage exceeds the first threshold (Vth1), the second judgment table $a_2$ is selected continuously until the power supply voltage drops below the second threshold (Vth2), and thus compared with cases such as where the first/second judgment tables are switched based on a single threshold such as with conventional technology, the problem of the first/second judgment tables switching frequently due to minute fluctuations caused by noise in the vicinity of the single threshold or the like also tends not to occur, and a stable specification operation is realized. Note that by including the divided voltage value (Vc.min) of the first threshold (Vth1) in the divided voltage value range of the external resistor 22b on the low resistance side, and including the divided voltage value (Vb.max) of the second threshold (Vth2) in the divided voltage value range of the external resistor 22c on the high resistance side, it becomes possible to more clearly define the divide between the divided voltage value ranges of the first/second judgment tables $a_1$ and $a_2$.

An embodiment of the present disclosure is described above in detail, but the present disclosure is not limited by the specific description thereof. For example, the above embodiment is described taking the case where the divided voltage value ranges of the pair of external resistors 22b and 22c having adjacent resistance values overlap as an example, but even if there are plural pairs of external resistors whose divided voltage value ranges overlap, each pair of external resistors can be handled similarly to the present embodiment. Also, the above embodiment is described taking the case where the present disclosure is applied to power windows of a vehicle as an example, but the present disclosure can naturally be similarly applied to other devices such as door mirrors installed in vehicles and to various devices installed in equipment other than vehicles.

Furthermore, the way of apportioning the divided voltage values of the external resistors at the first and second thresholds is not limited to the illustrated example, and any method that does not result in overlap can be set. Specifically, in the above embodiment, the first judgment table $a_1$ is selected until the power supply voltage exceeds the first threshold (Vth1), and the second judgment table $a_2$ is selected until the power supply voltage drops below the second threshold (Vth2) after exceeding the first threshold (Vth1). Alternatively, the first judgment table $a_1$ may be selected until the power supply voltage becomes greater than or equal to the first threshold (Vth1), and the second judgment table $a_2$ may be selected until the power supply voltage becomes less than or equal to the second threshold (Vth2) after becoming greater than or equal to the first threshold (Vth1). Furthermore, the first judgment table $a_1$ may be selected until the power supply voltage becomes greater than or equal to the first threshold (Vth1), and the second judgment table $a_2$ may be selected until the power supply voltage drops below the second threshold (Vth2) after becoming greater than or equal to the first threshold (Vth1).

Also, in the above embodiment, an example is illustrated in which the external resistor specification means A specifies an external resistor, based on a relational table a (first judgment table $a_1$, second judgment table $a_2$) showing, for each of the external resistors 22a, 22b and 22c, the range (Va.min to Va.max, Vb.min to Vb.max, Vc.min to Vc.max) that the divided voltage values can take with consideration for variance in each of the external resistors 22a, 22b and 22c, in the range (Vd.min to Vd.max) that the power supply voltage can take with consideration for variance. That is, the external resistor specification means A changes the divided voltage value ranges relating to the external resistors 22b and 22c whose divided voltage value ranges overlaps with each other according to the state of the power supply voltage, based on this relational table a, but the present disclosure is not limited thereto. In short, any configuration can be adopted as long as the external resistor specification means A can, for the respective divided voltage value ranges of the external resistors 22b and 22c whose divided voltage value ranges overlap, change the divided voltage value ranges of the external resistors 22b and 22c according to the state of the power supply voltage, using the divided voltage value ranges of the external resistors that depend on two types of power supply voltage and do not include an overlapping region.

The invention claimed is:

1. A microcomputer input/output circuit comprising:
a microcomputer;
a power supply;
a power supply resistor configured such that one end is connected to the power supply and another end is alternately connected to a plurality of grounded external resistors having different resistance values via a switch;
a power supply voltage monitoring unit configured to monitor a power supply voltage of the power supply;
a divided voltage value monitoring unit configured to monitor a divided voltage value obtained through voltage division by the power supply resistor and the external resistor that is selected; and
an external resistor specification means configured to specify the external resistor selected by the switch depending on which divided voltage value range corresponding to each of the external resistors the divided voltage value obtained by the divided voltage value monitoring unit is included,
wherein the external resistor specification means changes the divided voltage value ranges based on the power supply voltage acquired by the power supply voltage monitoring unit.

2. The microcomputer input/output circuit according to claim 1, wherein the external resistor specification means changes the divided voltage value ranges when the power supply voltage exceeds or becomes greater than or equal to a first threshold, and, after the power supply voltage exceeds or becomes greater than or equal to the first threshold, does not change the divided voltage value ranges until the power supply voltage drops below or becomes less than or equal to a second threshold that is smaller than the first threshold.

3. The microcomputer input/output circuit according to claim 2,
wherein the plurality of external resistors include two external resistors having adjacent resistance values,
the external resistor specification means, in a case where the divided voltage value range of the external resistor on a low resistance side and the divided voltage value range of the external resistor on a high resistance side include an overlapping region in which the divided voltage value ranges overlap, uses the power supply voltage corresponding to a lower limit of the divided voltage values of the overlapping region as the first threshold, and uses the power supply voltage corresponding to an upper limit of the divided voltage values of the overlapping region as the second threshold,
until the power supply voltage exceeds or becomes greater than or equal to the first threshold, the external resistor specification means sets the divided voltage value ranges of the two external resistors so as to eliminate the overlapping region of the external resistor on the low resistance side, and
until the power supply voltage exceeds or becomes greater than or equal to the first threshold and drops below or becomes less than or equal to the second threshold, the external resistor specification means sets the divided voltage value ranges of the two external resistors so as to eliminate the overlapping region of the external resistor on the high resistance side.

4. The microcomputer input/output circuit according to claim 2,
wherein the external resistor specification means has a relational table, acquired in advance, showing the relationship between the power supply voltage and the divided voltage value ranges, and, in a case where the divided voltage value ranges of two of the external resistors having adjacent resistance values include an overlapping region in which the divided voltage value ranges overlap, has, in the relation table, a first judgment table in which the power supply voltage corresponding to a lower limit of the divided voltage values of the overlapping region is added as the first threshold, and a second judgment table in which the power supply voltage corresponding to an upper limit of the divided voltage values of the overlapping region is added as the second threshold,
in the first judgment table, the divided voltage value ranges of the external resistors are set so as to eliminate the overlapping region of the external resistor on a low resistance side with the first threshold as a boundary, and, in the second judgment table, the divided voltage value ranges of the external resistors are set so as to eliminate the overlapping region of the external resistor on a high resistance side with the second threshold as a boundary, and
the external resistor specification means selects the first judgment table until the power supply voltage exceeds or becomes greater than or equal to the first threshold, selects the second judgment table until the power supply voltage exceeds or becomes greater than or equal to the first threshold and drops below or becomes less than or equal to the second threshold after exceeding the first threshold, and specifies the external resistor corresponding to the divided voltage value based on the judgment tables.

5. The microcomputer input/output circuit according to claim 4,
wherein, in the first judgment table, the divided voltage value at the first threshold is set as an upper limit of the divided voltage value range of the external resistor on the low resistance side, and the divided voltage value range of the external resistor on the high resistance side is set to a range above the divided voltage value at the first threshold,
in the second judgment table, the divided voltage value at the second threshold is set as a lower limit of the divided voltage value range of the external resistor on the high resistance side, and the divided voltage value range of the external resistor on the low resistance side is set to a smaller range than the divided voltage value at the second threshold, and the external resistor specification means selects the first judgment table until the power supply voltage exceeds the first threshold, and selects the second judgment table until the power supply voltage drops below the second threshold after exceeding the first threshold.

* * * * *